United States Patent
Yang et al.

(10) Patent No.: US 7,821,051 B2
(45) Date of Patent: Oct. 26, 2010

(54) MIM CAPACITOR AND METHOD OF FABRICATING SAME

(75) Inventors: Chih-Chao Yang, Poughkeepsie, NY (US); Lawrence A. Clevenger, La Grangeville, NY (US); Timothy J. Dalton, Ridgefield, CT (US); Louis C. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 11/625,883

(22) Filed: Jan. 23, 2007

(65) Prior Publication Data

US 2007/0117313 A1    May 24, 2007

Related U.S. Application Data

(62) Division of application No. 11/106,887, filed on Apr. 15, 2005, now Pat. No. 7,223,654.

(51) Int. Cl.
*H01L 27/108* (2006.01)
(52) U.S. Cl. .................. 257/301; 257/306; 257/310; 257/E21.008
(58) Field of Classification Search .................. 257/301, 257/532, 306, 310, E21.008
See application file for complete search history.

(56) References Cited

U.S. PATENT DOCUMENTS

| | | | |
|---|---|---|---|
| 5,675,184 A | 10/1997 | Matsubayashi et al. | |
| 5,879,985 A | 3/1999 | Gambino et al. | |
| 6,028,362 A | 2/2000 | Omura | |
| 6,329,234 B1 | 12/2001 | Ma et al. | |
| 6,346,454 B1 * | 2/2002 | Sung et al. | 438/396 |
| 6,452,251 B1 | 9/2002 | Bernstein et al. | |
| 6,461,914 B1 | 10/2002 | Roberts et al. | |
| 6,670,237 B1 | 12/2003 | Loh et al. | |
| 6,670,274 B1 * | 12/2003 | Liu et al. | 438/692 |
| 6,764,915 B2 | 7/2004 | Lee | |
| 2005/0073053 A1 | 4/2005 | Park | |

* cited by examiner

*Primary Examiner*—Michael Trinh
(74) *Attorney, Agent, or Firm*—Schmeiser, Olsen & Watts; Louis J. Percello

(57) ABSTRACT

A damascene MIM capacitor and a method of fabricating the MIM capacitor. The MIN capacitor includes a dielectric layer having top and bottom surfaces; a trench in the dielectric layer, the trench extending from the top surface to the bottom surface of the dielectric layer; a first plate of a MIM capacitor comprising a conformal conductive liner formed on all sidewalls and extending along a bottom of the trench, the bottom of the trench coplanar with the bottom surface of the dielectric layer; an insulating layer formed over a top surface of the conformal conductive liner; and a second plate of the MIM capacitor comprising a core conductor in direct physical contact with the insulating layer, the core conductor filling spaces in the trench not filled by the conformal conductive liner and the insulating layer. The method includes forming portions of the MIM capacitor simultaneously with damascene interconnection wires.

26 Claims, 16 Drawing Sheets

MIM CAPACITOR AND METHOD OF FABRICATING SAME

RELATED APPLICATIONS

This application is a division of U.S. application Ser. No. 11/106,887 filed on Apr. 15, 2005 now U.S. Pat. No. 7,223,654.

FIELD OF THE INVENTION

The present invention relates to the field of integrated circuits and integrated circuit fabrication; more specifically, it relates to metal-insulator-metal capacitor and a method of fabricating the metal-insulator-metal capacitor.

BACKGROUND OF THE INVENTION

Metal-insulator-metal capacitors (MIM or MIM cap) are integrated into various integrated circuits for applications such as analog-logic, analog-to-digital, mixed signal and radio frequency circuits. Current methods of integration of MIMs into integrated circuits require multiple extra photolithographic and etching steps beyond those required for all other components of the integrated circuits thus adding considerable cost and time to the manufacture of integrated circuits incorporating MIMs.

Thus, there is a need for a simple and inexpensive integration scheme for fabrication of integrated circuits utilizing MIMs.

SUMMARY OF THE INVENTION

The present invention utilizes damascene and dual damascene technology to fabricate MIMs in wiring levels of integrated circuits. The MIMs are fabricated simultaneously with normal damascene and dual damascene wires and vias by adding a number of steps to a dual damascene process. The MIMs themselves are dual damascene structures.

A first aspect of the present invention is a structure, comprising: a dielectric layer on a top surface of a semiconductor substrate, the dielectric layer having a top surface and a bottom surface; a trench in the dielectric layer, the trench extending from the top surface to the bottom surface of the dielectric layer; a first plate of a MIM capacitor comprising a conformal conductive liner having a top surface and a bottom surface, the bottom surface of the conformal conductive liner in direct physical contact with all sidewalls and extending along a bottom of the trench, the bottom of the trench coplanar with the bottom surface of the dielectric layer; a conformal insulating layer formed on a top surface of the conformal conductive liner; and a second plate of the MIM capacitor comprising a single layer of a core conductor in direct physical contact with the insulating layer, the core conductor filling spaces in the trench not filled by the conformal conductive liner and the insulating layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form damascene wires (or damascene vias).

A dual damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias. While vias often have square cross-sections when viewed from above, vias may be elongated to have rectangular cross sections when viewed from above and are then known as via bars. Therefore, a via with a square cross-section should be considered as a special case of a via bar.

Unless otherwise noted, trenches, via openings, and other openings or patterns formed in the various layers of the present invention are formed by conventional photolithography by applying a photoresist layer, exposing the photoresist layer to electromagnetic radiation through a mask, developing a pattern in the exposed photoresist layer and etching the regions of exposed layer with either a wet or a dry etch. An example of a dry etch is a reactive ion etch (RIE).

FIGS. 1A through 1E are cross-sectional drawings illustrating common steps for manufacture of MIM capacitor devices according to the various embodiments of the present invention. In FIG. 1, a semiconductor substrate 100 having top surface 105 is provided. Semiconductor substrate may include active devices such as transistor and diodes as well as passive devices such as resistors and one or more wiring levels for interconnecting the active and passive devices into integrated circuits. An interlevel dielectric layer 110 is formed on top surface 105 of substrate 100. Conductors 115A and 115B formed in dielectric layer 110. Top surfaces 120A and 120B respectively of conductors 115A and 155B are coplanar with a top surface 125 of dielectric layer 110. In the present example, conductors 115A and 115B are damascene conductors. In one example, conductor 115A and 115B comprise copper and dielectric layer is a silicon based dielectric.

Figure 1A:
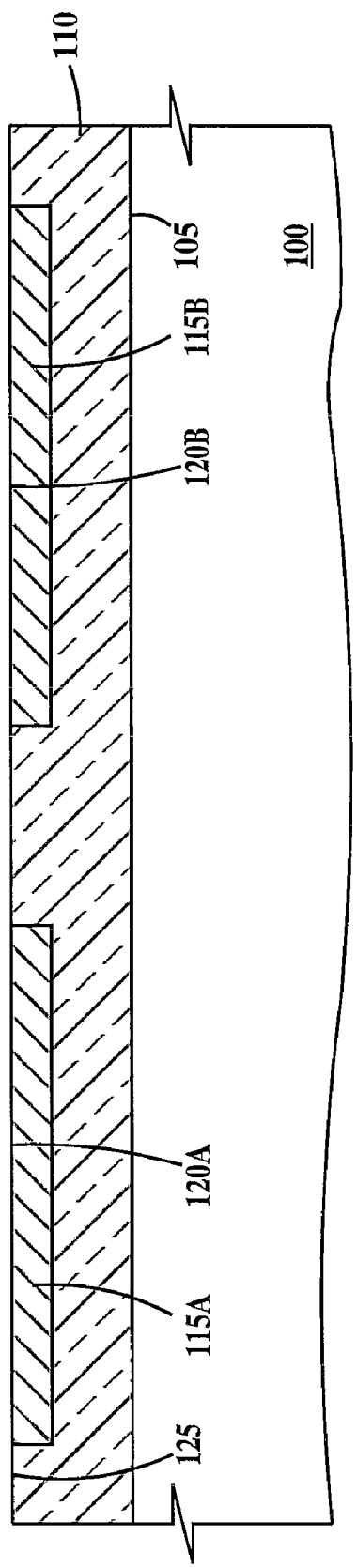
FIGS. 1A through 1E are cross-sectional drawings illustrating common steps for manufacture of MIM capacitor devices according to the various embodiments of the present invention.
Figure 1B:
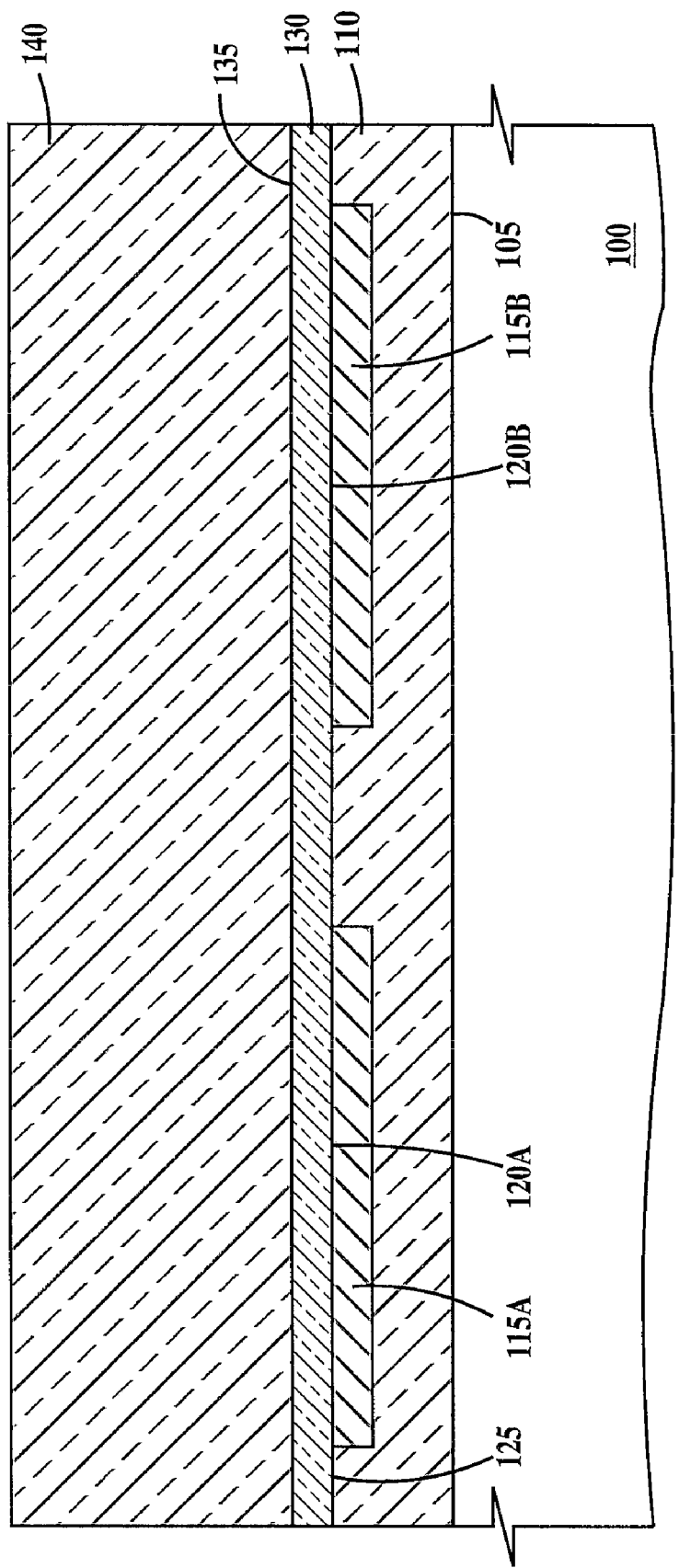

In FIG. 1B, a dielectric layer 130 is formed as on top surfaces 120A and 120B respectively of conductors 115A and 115B as well on a top surface 125 of dielectric layer 110. Formed on a top surface 135 of dielectric layer 130 is an interlevel dielectric layer 140. Dielectric layer 130 may comprise, for example, silicon dioxide ($SiO_2$), silicon nitride ($Si_3N_4$), silicon carbide (SiC), silicon oxy nitride (SiON), silicon oxy carbide (SiOC), hydrogen doped silica glass (SiCOH), plasma-enhanced silicon nitride ($PSiN_x$) or NBLoK (SiC(N,H)). Dielectric layer 130 may be, for example, between about 5 nm and about 100 nm thick. In one example, dielectric layer 140 is a low K (dielectric constant) material, examples of which include but are not limited to hydrogen silsesquioxane polymer (HSQ), methyl silsesquioxane polymer (MSQ) and polyphenylene oligomer ($SiO_x(CH_3)_y$). A low K dielectric material has a relative permittivity of about 4 or less. In a second example, dielectric layer 140 comprises $SiO_2$. Dielectric layer 140 may be, for example, between about 50 nm and about 1,000 nm thick.

Figure 1C:
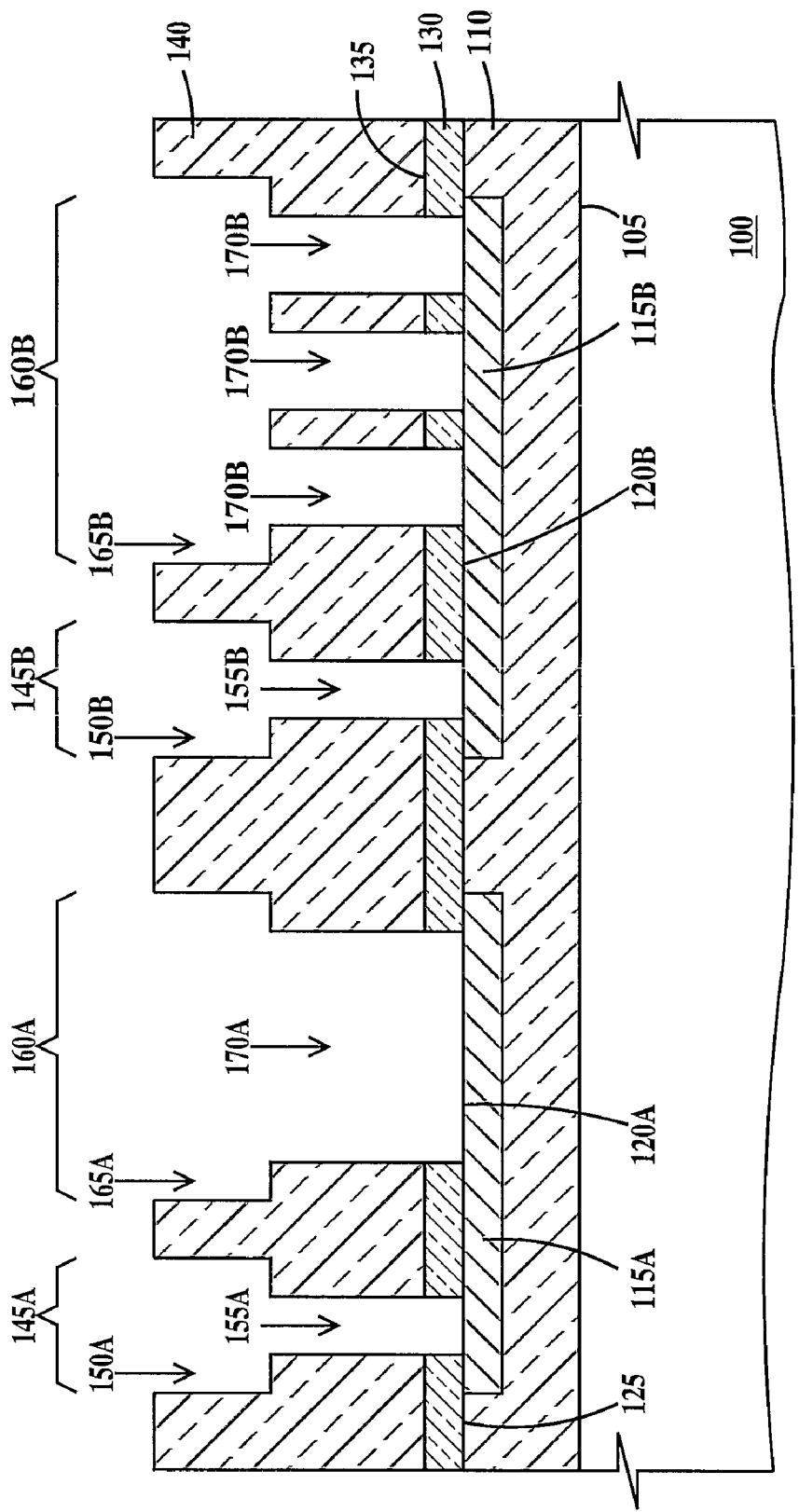

In FIG. 1C, formed in a first region 145A of dielectric layer 140 is a trench 150A and a via opening 155A. Formed in a second region 160A of dielectric layer 140 is a trench 165A and a single via bar opening 170A. Formed in a third region 145B of dielectric layer 140 is a trench 150B and a via opening 155B. Formed in a fourth region 160B of dielectric layer 140 is a trench 165B and a multiple via bar openings 170B. While three via bar opening 170B are illustrated in FIG. 1C, there may be any number of via bar openings, with two as a minimum number of via bar openings. Via openings 155A and via bar opening 170A extend to conductor 115A and via opening 155B and via bar openings 170B extend down to conductor 115B.

Figure 1D:
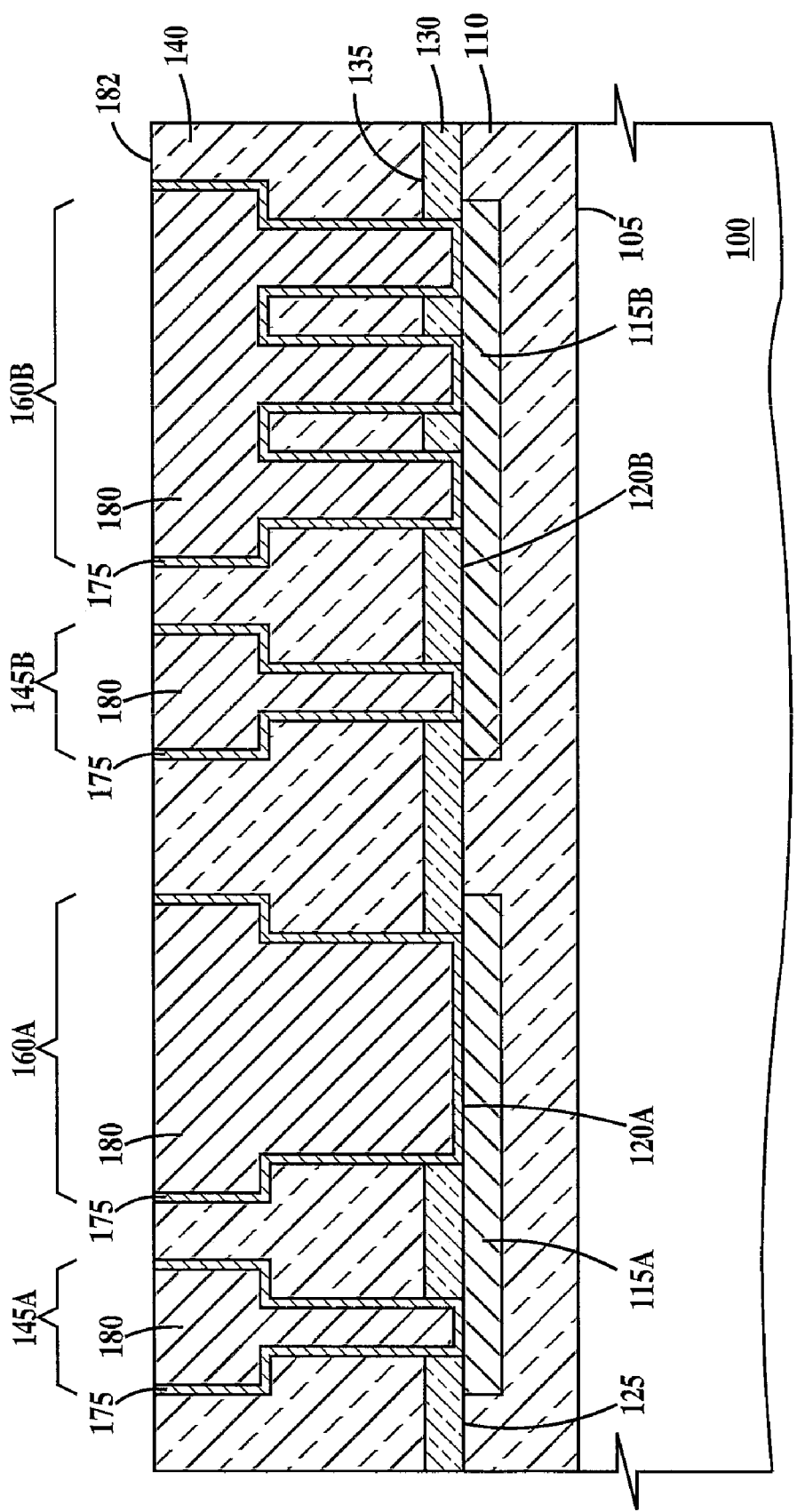

In FIG. 1D, a conformal conductive liner 175 is formed on all sidewalls of trenches 150A, 165A, 150B and 165B (see FIG. 1C), via openings 155A and 155B (see FIG. 1C) and via bar openings 170A and 170B (see FIG. 1C). Liner 175 is in direct electrical contact with conductors 115A and 115B. Then trenches 150A, 165A, 150B and 165B (see FIG. 1C), via openings 155A and 155B (see FIG. 1C) and via bar openings 170A and 170B (see FIG. 1C) are filled with a core conductor 180. Liner 175 may act as a copper diffusion barrier. In one example, liner 175 comprises Ta, TaN, Ti, TiN, TiSiN, W, Ru or combinations thereof. In one example, liner 175 is between about 5 nm and about 100 nm thick. In one example, core conductor 180 is Cu, Al, AlCu or W.

The processes used to fill regions 145A, 145B, 160A and 160B are damascene processes. A conformal layer of liner material is deposited, a layer of core material is formed (in the example of core conductor 180 being copper, a thin copper layer is evaporated or deposited and then a thicker layer of copper is electroplated) followed by a CMP to planarize dielectric layer 140, liner 175 and core conductor 180 to a common surface 182. The processes used and the structures formed in regions 145A, 145B, 160A and 160B are the same as used to form the conventional wires, vias and via bars in other regions (not shown) of dielectric layer 140 that are used to form circuits from devices contained in the substrate 100.

Figure 1E:
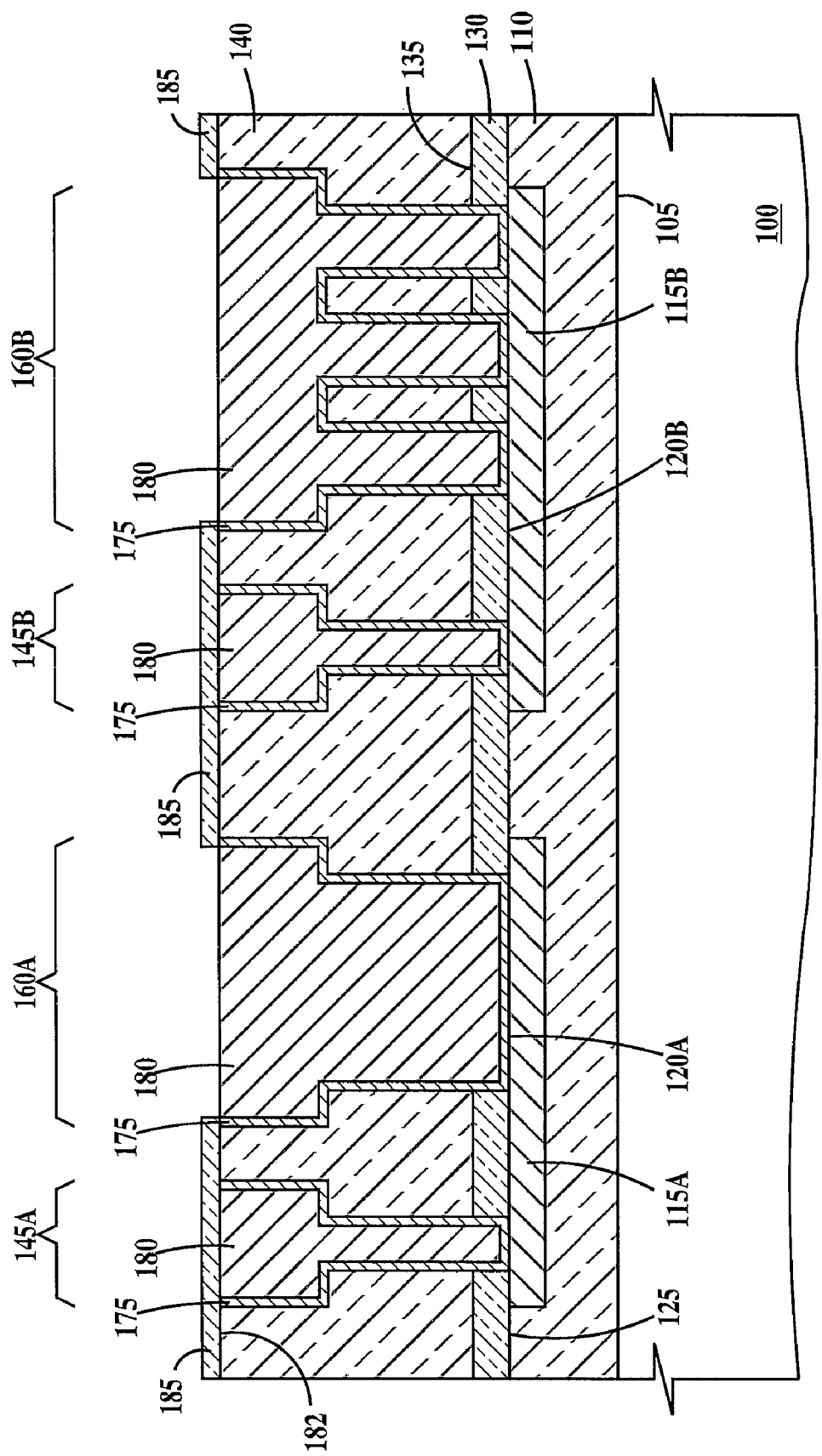

In FIG. 1E, a hard mask layer 185 is formed and patterned to expose core conductor 180 in regions 160A and 160B but in no other regions of dielectric layer 140 including those regions in which the conventional wires described supra were simultaneously formed. Hard mask layer 185 may comprise a dielectric material, for example, silicon dioxide, silicon nitride, silicon carbide, silicon oxy nitride, silicon oxy carbide, hydrogen doped silica glass, plasma-enhanced silicon nitride or NBLoK. Dielectric layer 185 may be, for example, between about 5 nm and about 100 nm thick. It is possible for hard mask layer 185 to comprise a metal.

Figure 2A:
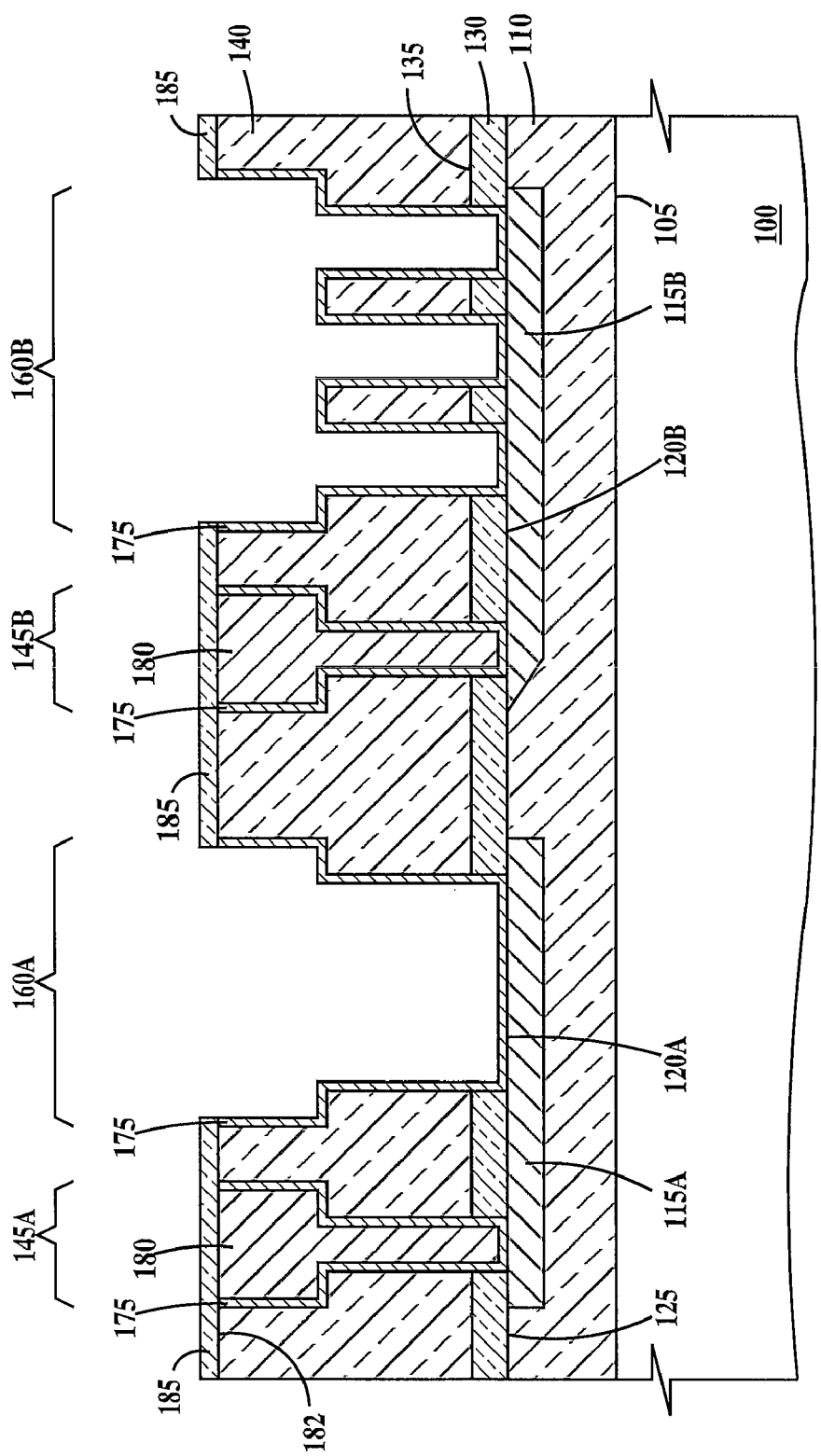
FIGS. 2A through 2D are cross-sectional drawings illustrating steps for manufacture of MIM capacitor devices according to a first and a second embodiment of the present invention.

FIGS. 2A through 2D are cross-sectional drawings illustrating steps for manufacture of MIM capacitor devices according to a first and a second embodiment of the present invention. In FIGS. 2A through 2D, a MIM capacitor according to the first embodiment of the present invention will be formed in region 160A and a MIM capacitor according to the second embodiment of the present invention will be formed in region 160B. In FIG. 2A, all of core conductor 180 is removed from regions 160A and 160B (see FIG. 1E). In one example, an etchant comprising $HNO_3$, HCl, $H_2SO_4$, HF or combinations thereof is used to wet etch the core conductor.

Figure 2B:
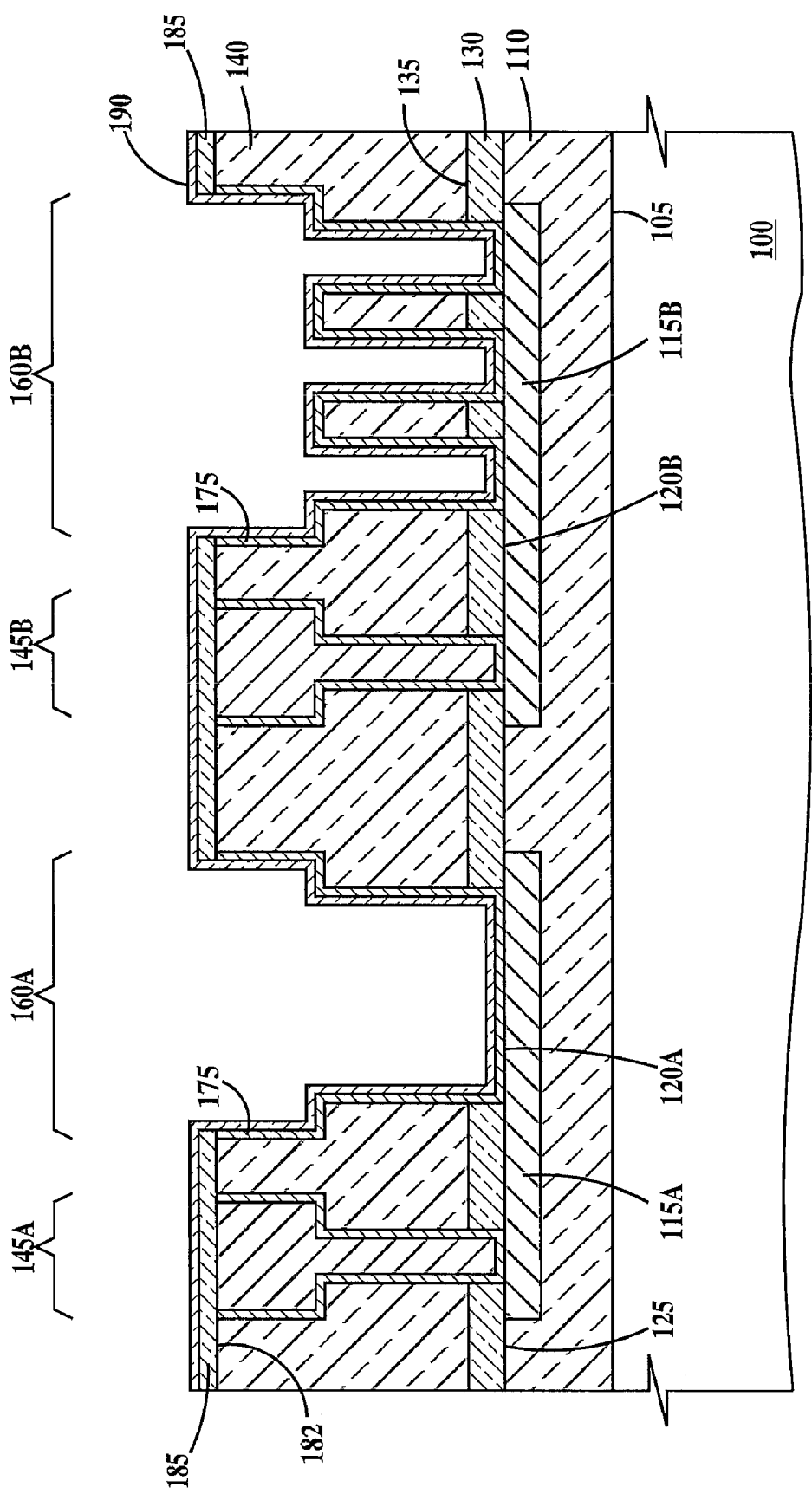

In FIG. 2B, a dielectric layer 190 is blanket deposited and it should be particularly noted that dielectric layer covers all surfaces of liner 175 in regions 160A and 160B. In one example dielectric layer 190 comprises silicon dioxide, silicon nitride, silicon carbide, silicon oxy nitride, silicon oxy carbide, hydrogen doped silica glass, plasma-enhanced silicon nitride, NBLoK, a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations thereof. A high K dielectric material has a relative permittivity above 10. In one example, dielectric layer 190 is between about 2 nm and about 100 nm thick.

Figure 2C:
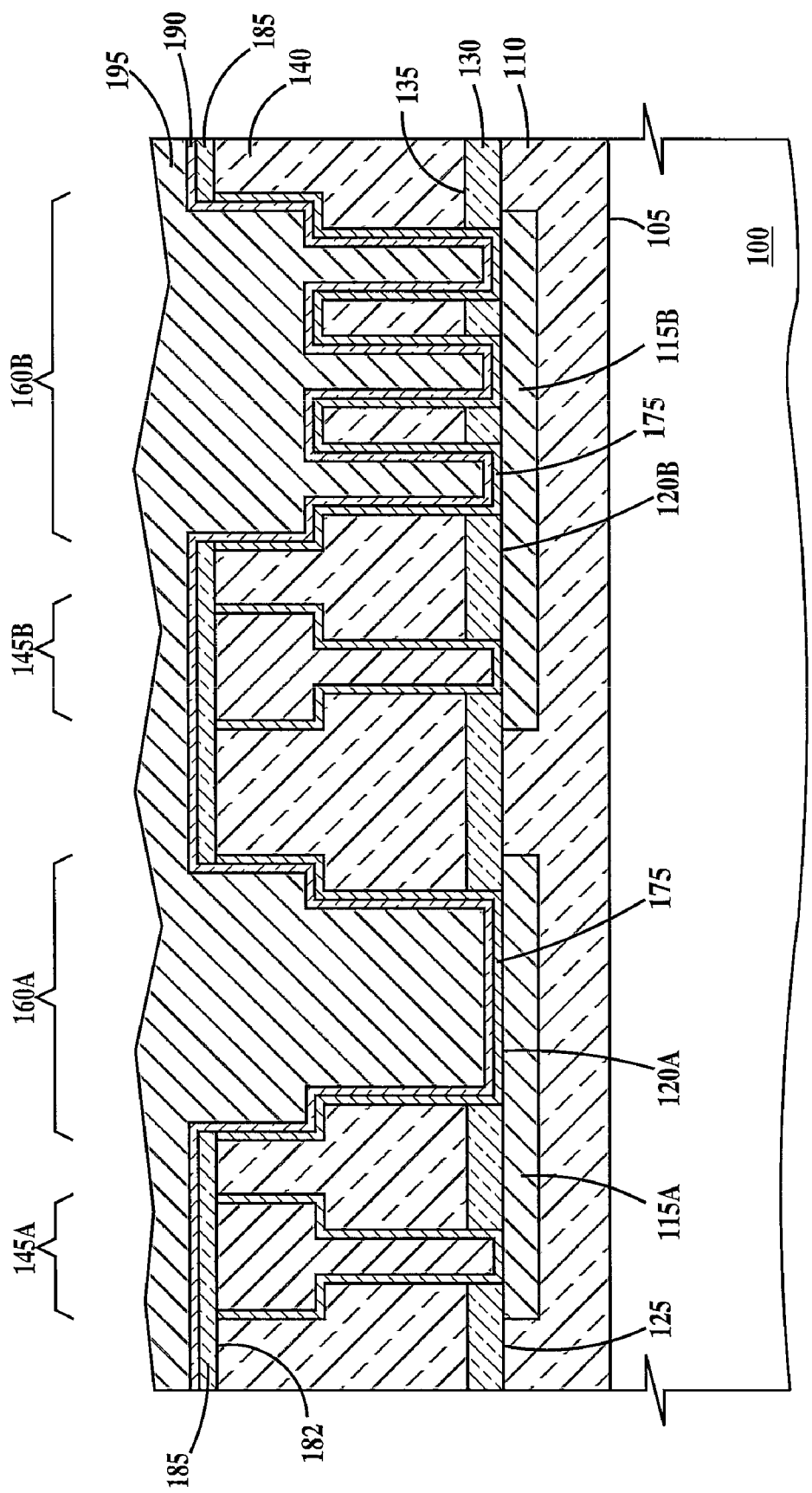

In FIG. 2C, a core conductor 195 is formed over dielectric layer 190. In one example, core conductor 195 is copper formed evaporation or deposition of a thin layer of copper over dielectric layer 190 followed by electroplating a thicker layer of copper. In a second example, core conductor 195 is copper or another metal formed by physical vapor deposition (PVD), chemical vapor deposition (CVD) or electroless plating. In a third example, conductor 190 is same as one or all of the materials used to form the conventional wires, vias and via bars that are used to form circuits from devices contained in the substrate 100. Core conductor 195 is thick enough to completely fill regions 160A and 160B.

Figure 2D:
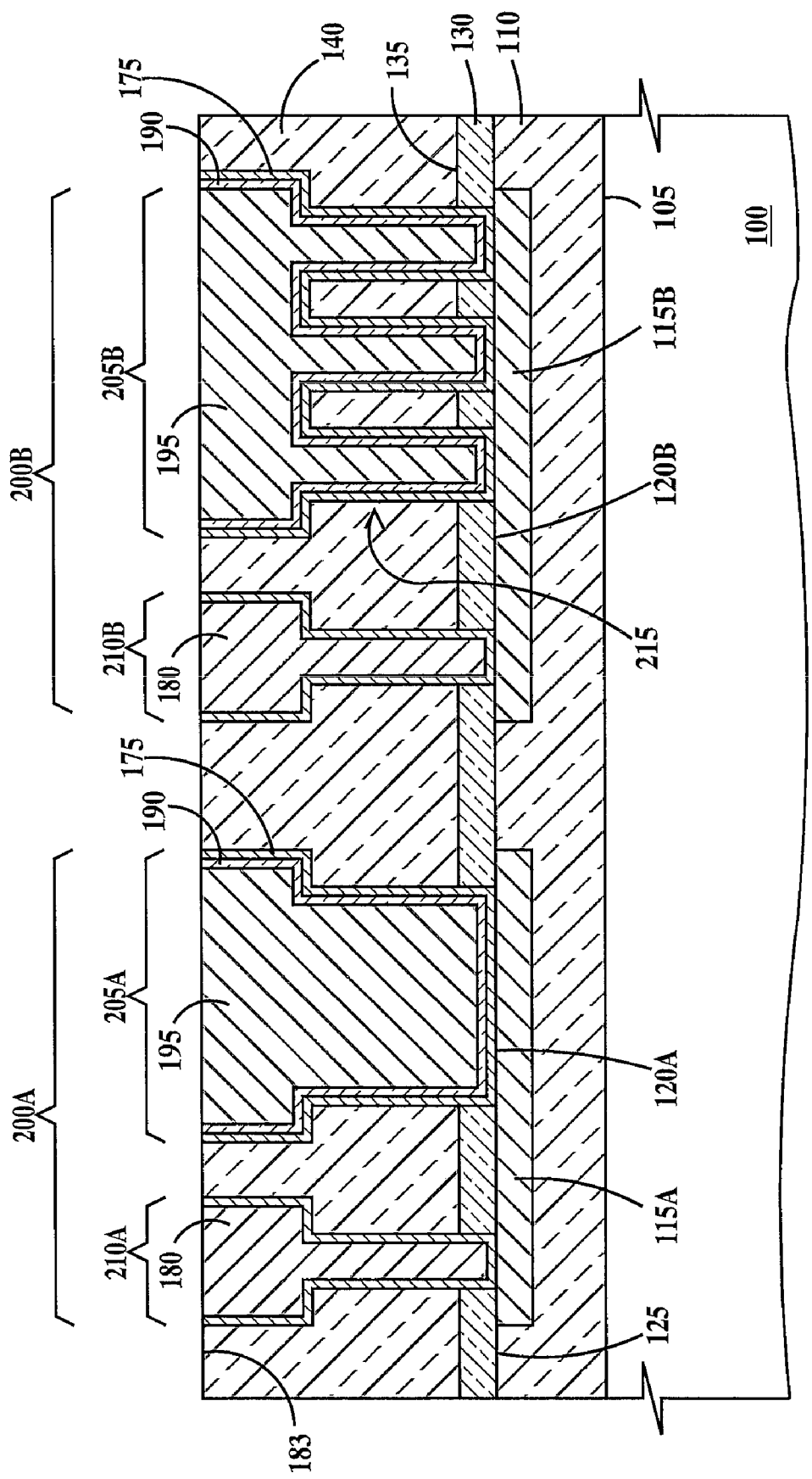

In FIG. 2D, a CMP process is used to remove all excess core conductor 195, dielectric layer 190 and dielectric layer 185 (see FIG. 2C) and form a common planer surface 183 with dielectric layer 140.

In FIG. 2D a first device 200A comprises a MIM capacitor 205A, a contact 210A and conductor 115A. A first plate of MIM capacitor 205A comprises core conductor 195. The insulator of MIM capacitor 205A comprises dielectric layer 190. A second plate of MIM capacitor 205A comprises conductive liner 175. Electrical connection between the second plate of MIM capacitor 205A is via contact 210A through conductor 115A. It should be noted that contacts 210A and 210B are identical to dual damascene wires that are formed in dielectric layer 140 as interconnect wiring of the integrated chip.

A second device 200B comprises a MIM capacitor 205B, a contact 210B and conductor 115B. A first plate of MIM capacitor 205B comprises core conductor 195. The insulator of MIM capacitor 205B comprises dielectric layer 190. A second plate of MIM capacitor 205B comprises conductive liner 175. Electrical connection between the second plate of MIM capacitor 205B is via contact 210B through conductor 115B.

The essential difference between MIM capacitor 205A and 205B is MIM capacitor 205B has more dielectric area because of the use of crenulations 215 in the lower portion of the structure, that portion contacting conductor 115B.

Figure 2E:
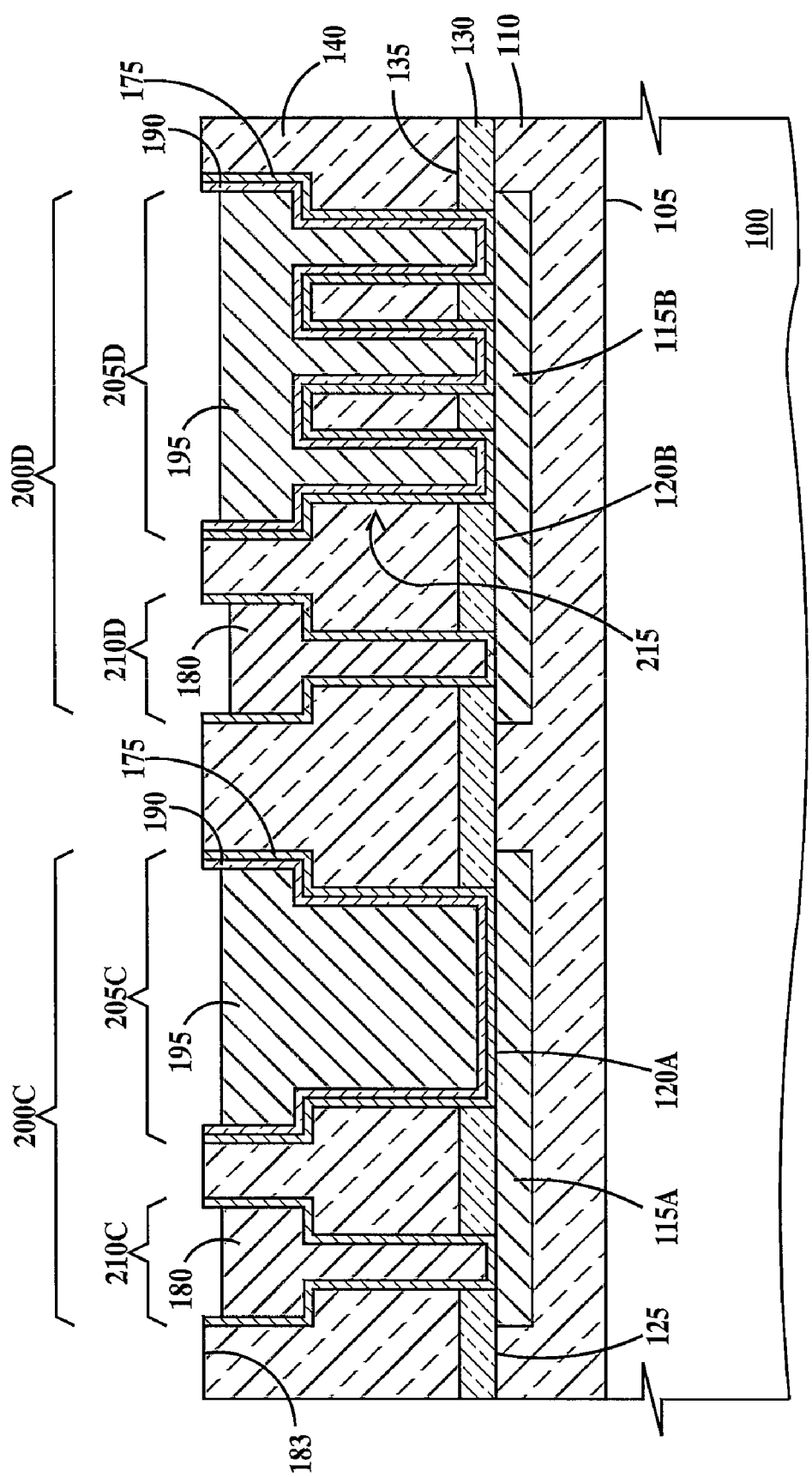
FIG. 2E is a cross-sectional drawings illustrating steps for manufacture of MIM capacitor devices according to a third and a fourth embodiment of the present invention.

FIG. 2E is a cross-sectional drawings illustrating steps for manufacture of MIM capacitor devices according to a third and a fourth embodiment of the present invention. In FIG. 2E, a first device 200C comprises a MIM capacitor 205C, a contact 210C and conductor 115A. A first plate of MIM capacitor 205C comprises core conductor 195. A second device 200D comprises a MIM capacitor 205D, a contact 210D and conductor 115B. A second plate of MIM capacitor 205D comprises conductive liner 175.

In FIG. 2E, an optional recess process is performed to recess core conductors 180 and 195 below surface 183. This reduces the possibility of shorts between conductive liner 175 and core conductor 195. In one example, the recess process is a wet etch using an etchant comprising $HNO_3$, HCl, $H_2SO_4$, HF or combinations thereof. In a second example, the CMP process used to generate the structures of FIG. 2D are adjusted to cause dishing in at least core conductor 195 of MIM capacitors 205C and 205D. Dishing is phenomenon of CMP where large features do not polish straight across, but curve convexly or concavely in the same sense as concave and convex optical lenses are defined. In one example, the recess is between about 1 m and about 100 nm below top surface 183.

FIGS. 3A through 3D are cross-sectional drawings illustrating steps for manufacture of MIM capacitor devices according to a fifth and a sixth embodiment of the present invention. In FIGS. 3A through 3D, a MIM capacitor according to the fifth embodiment of the present invention will be formed in region 160A and a MIM capacitor according to the sixth embodiment of the present invention will be formed in region 160B. FIGS. 3A through 3D are similar to FIGS. 2A through 2D so only the differences will be described infra.

Figure 3A:
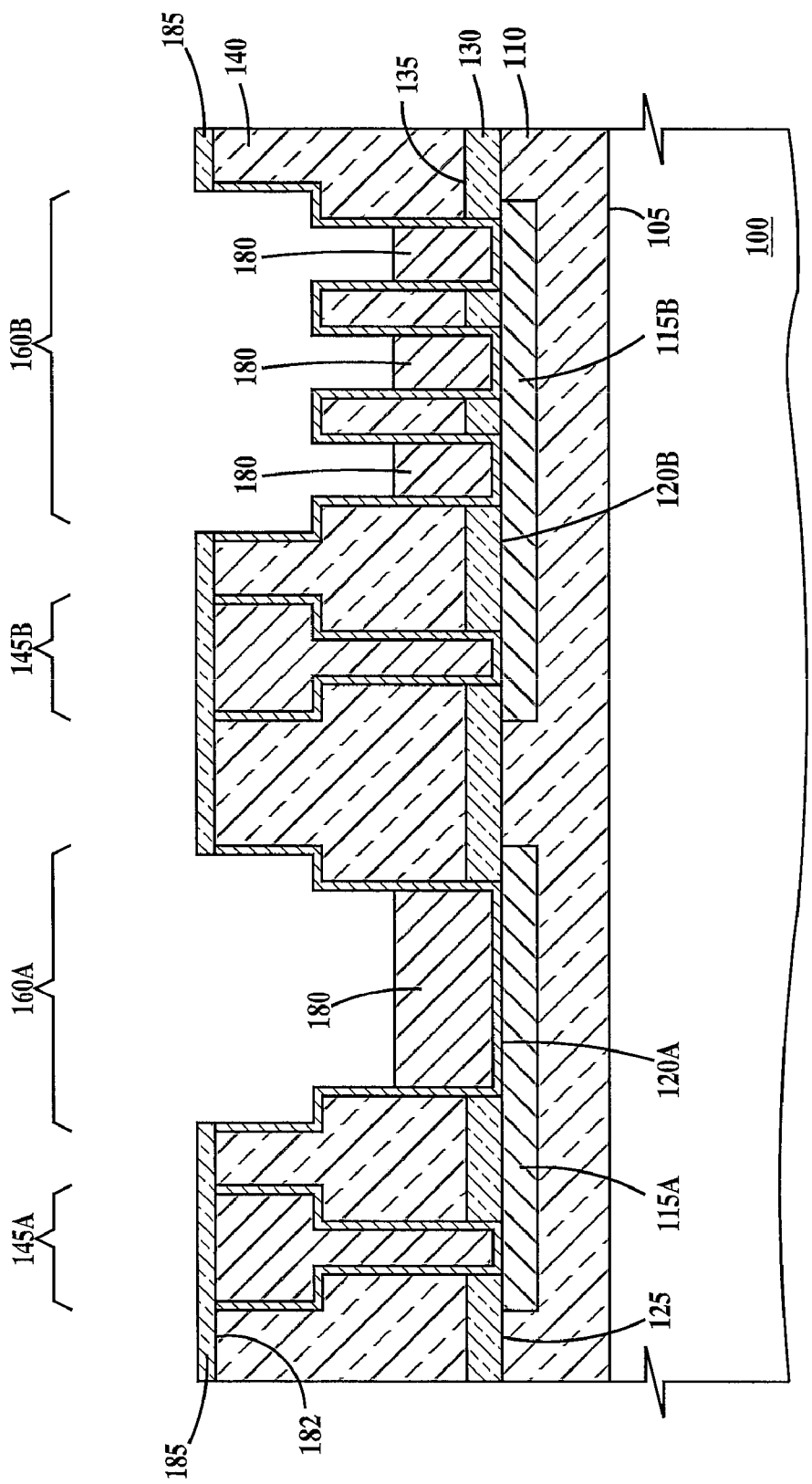
FIGS. 3A through 3D are cross-sectional drawings illustrating steps for manufacture of MIM capacitor devices according to a fifth and a sixth embodiment of the present invention.

In FIG. 3A, an uppermost portion of core conductor 180 is removed from regions 160A and 160B (see FIG. 1E). In one example, an etchant comprising $HNO_3$, HCl, $H_2SO_4$, HF or combinations thereof is used to wet etch the core conductor. Thus some core conductor 195 remains in direct and physical contact with liner 175 in regions 160A and 160B.

Figure 3B:
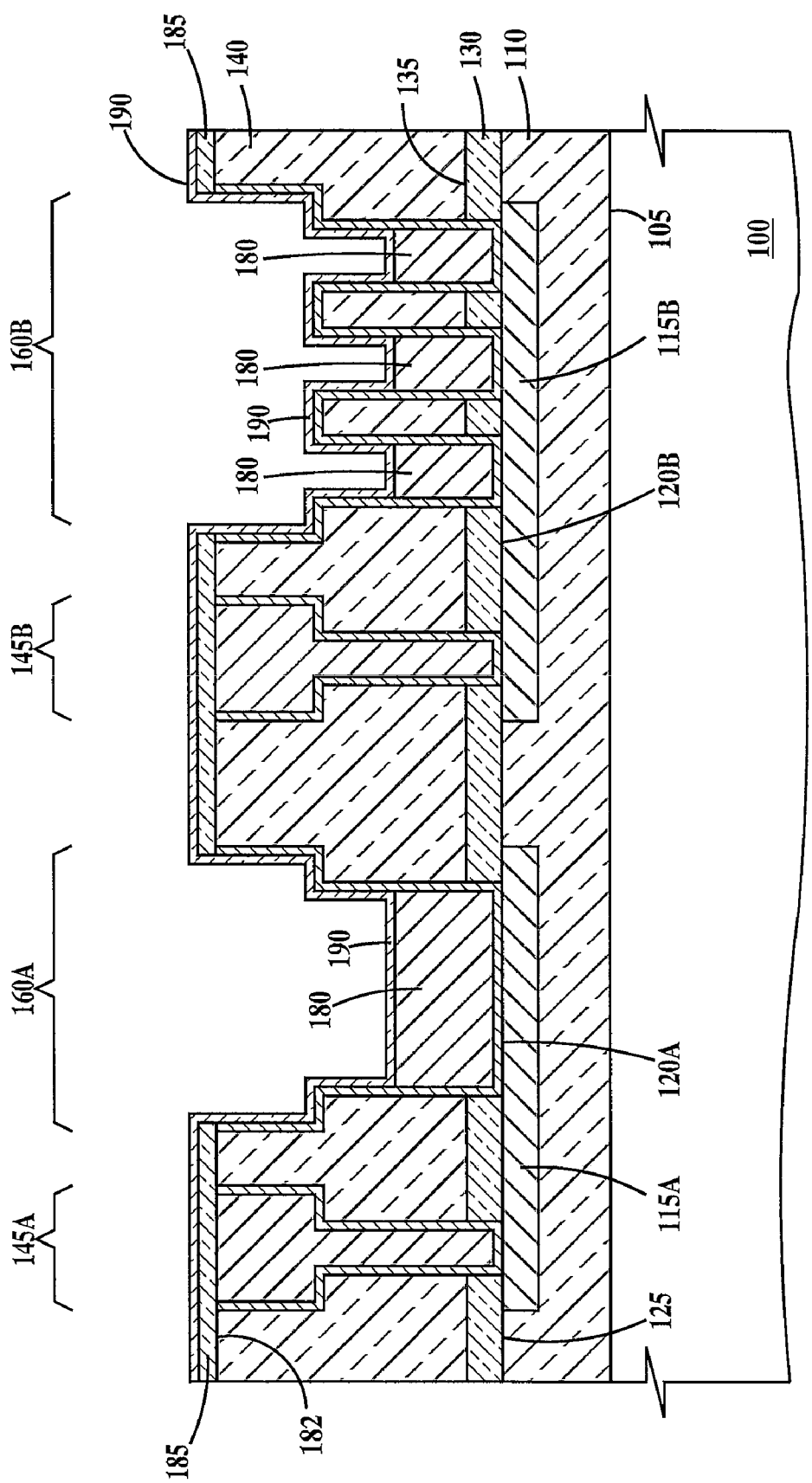
Figure 3C:
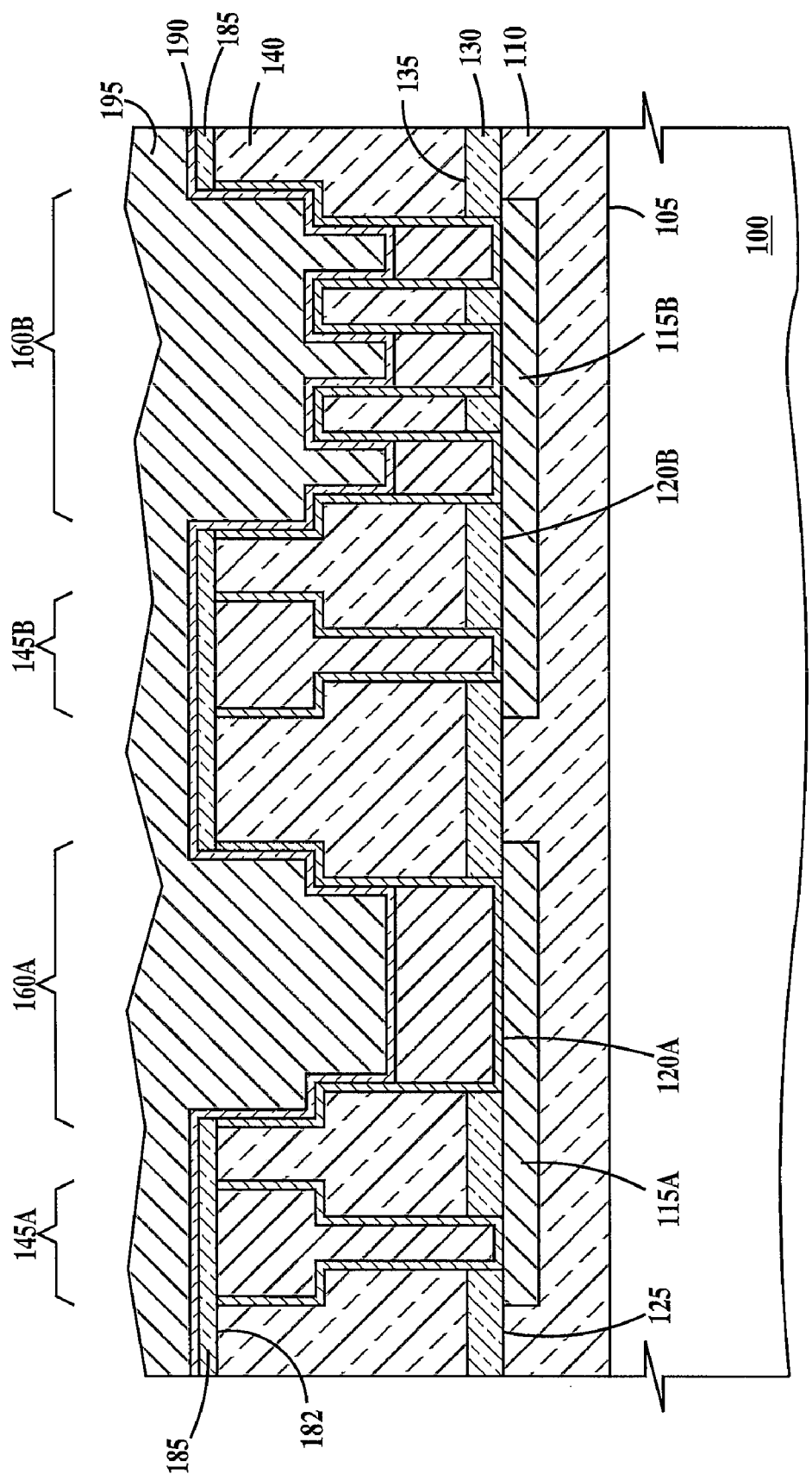

In FIG. 3B, dielectric layer 190 contacts remaining portions of conductor 180 in regions 160A and 160B.

Figure 3D:
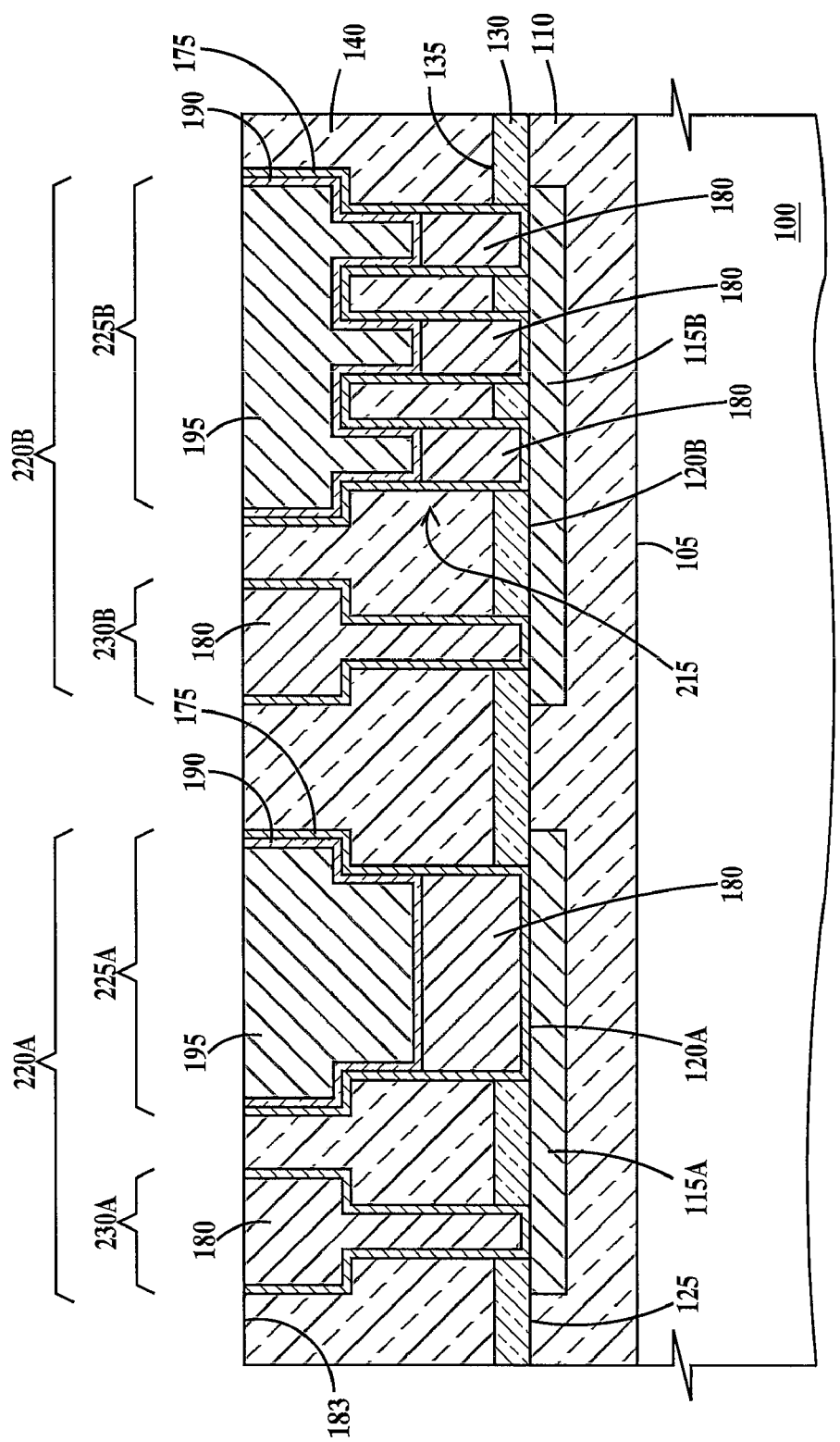

In FIG. 3D a first device 220A comprises a MIM capacitor 225A, a contact 230A and conductor 115A. A first plate of MIM capacitor 225A comprises core conductor 195. The insulator of MIM capacitor 225A comprises dielectric layer 190. A first portion of a second plate of MIM capacitor 225A comprises conductive liner 175. Remaining conductor 180 comprises a second portion of second plate of MIM capacitor 225A. Electrical connection between the second plate of MIM capacitor 225A is via contact 230A through conductor 115A.

A second device 220B comprises a MIM capacitor 225B, a contact 230B and conductor 115B. A first portion of a second plate of MIM capacitor 225B comprises conductive liner 175. Remaining conductor 180 comprises a second portion of second plate of MIM capacitor 225B. The insulator of MIM capacitor 225B comprises dielectric layer 190. A first plate of MIM capacitor 225B comprises core conductor 195. Electrical connection between the second plate of MIM capacitor 225B is via contact 230B through conductor 115B.

It should be noted that contacts 230A and 230B are identical to dual damascene wires that are formed in dielectric layer 140 as interconnect wiring of the integrated chip.

Figure 3E:
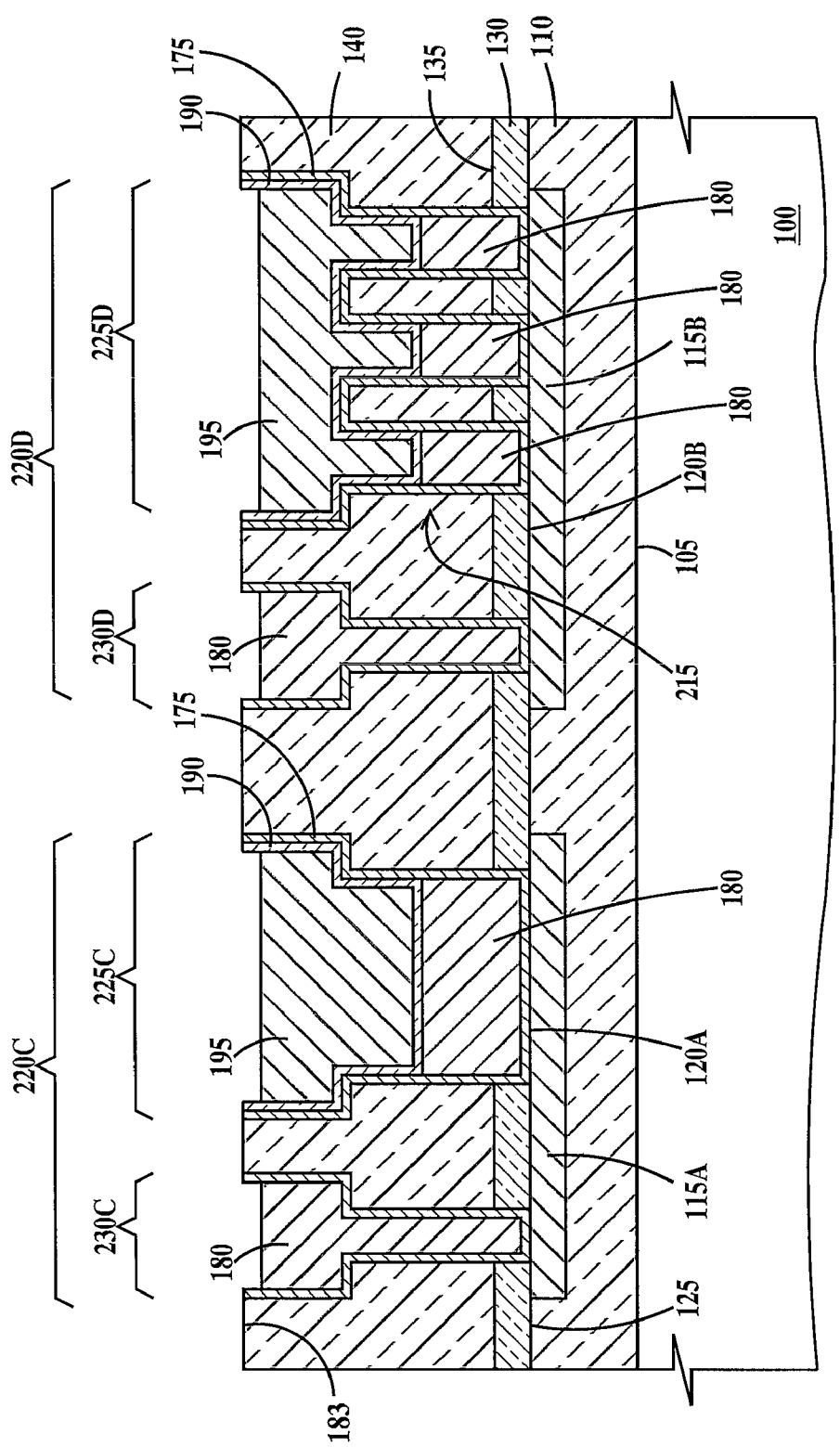
FIG. 3E is a cross-sectional drawings illustrating steps for manufacture of MIM capacitor devices according to a seventh and an eighth embodiment of the present invention.

FIG. 3E is a cross-sectional drawings illustrating steps for manufacture of MIM capacitor devices according to a seventh and an eighth embodiment of the present invention. In FIG. 3E, a first device 220C comprises a MIM capacitor, a contact 230C and conductor 115A. A first plate of MIM capacitor 225C comprises core conductor 195. The insulator of MIM capacitor 225C comprises dielectric layer 190. A first portion of a second plate of MIM capacitor 225C comprises conductive liner 175. Remaining conductor 180 comprises a second portion of second plate of MIM capacitor 225C.

A second device 220D comprises a MIM capacitor 225B, a contact 230D and conductor 115B. A first plate of MIM capacitor 225D comprises core conductor 195. The insulator of MIM capacitor 225D comprises dielectric layer 190. A first portion of a second plate of MIM capacitor 225D comprises conductive liner 175. Remaining conductor 180 comprises a second portion of second plate of MIM capacitor 225D. Electrical connection between the second plate of MIM capacitor 225D is via contact 230D through conductor 115B.

In FIG. 3E, an optional recess process is performed to recess core conductors 180 and 195 below surface 183 as described supra in reference to FIG. 2E. In one example, the recess is between about 1 nm and about 100 nm below top surface 183.

Figure 4:
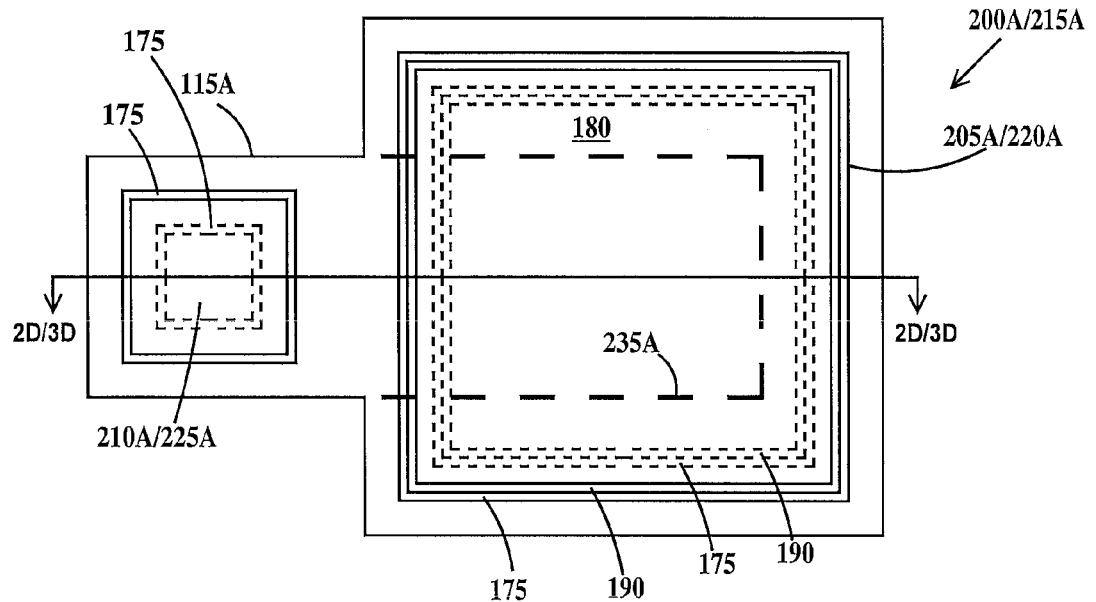
FIG. 4 is a top view of a MIM capacitor according to the first, third, fifth and seventh embodiments of the present invention.

FIG. 4 is a top view of a MIM capacitor according to the first, third, fifth and seventh embodiments of the present invention. In FIG. 4, conductor 115A extends under contact 210A/230A and completely under MIM capacitor 205A/225A providing electrical connection to the second plate of the capacitor formed from liner 175. In FIG. 4, heavy dashed line 235A defines an alternate shape for conductor 115A, illustrating that conductor 115A needs only to contact a portion of conductive liner 175.

Figure 5:
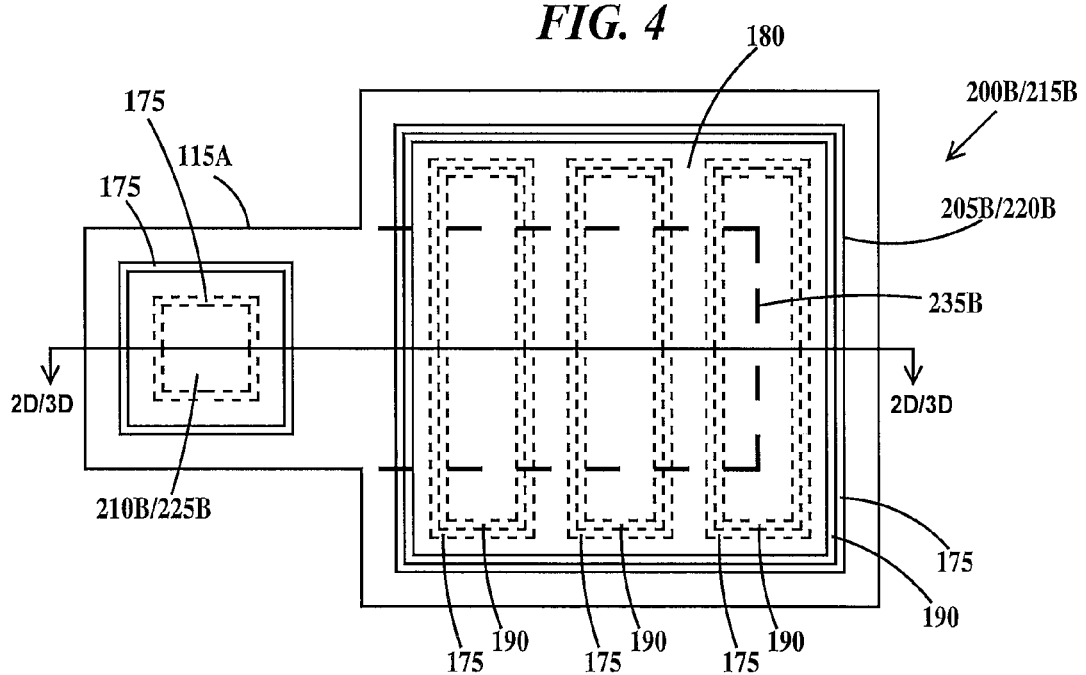
FIG. 5 is a top view of a MIM capacitor according to the second, fourth, sixth and eight embodiments of the present invention.

FIG. 5 is a top view of a MIM capacitor according to the second, fourth, sixth and eighth embodiments of the present invention. In FIG. 5, conductor 115A extends under contact 210B/230B and under MIM capacitor 205B/225B providing electrical connection to the second plate of the capacitor formed from liner 175 and conductor 180. In FIG. 5, heavy dashed line 235B defines an alternate shape for conductor 115B, illustrating that conductor 115B needs only to contact a portion of conductive liner 175.

While FIG. 5 illustrates crenulations 215 as a row via bars, however crenulations 215 can be replaced with a row of square vias, a row of circular vias, an array of square vias, and array of circular vias, an array of via bars, rows and arrays of other vias having other geometric shapes and combinations thereof.

Therefore, the present invention provides a simple and inexpensive integration scheme for fabrication of integrated circuits utilizing MIMs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
  a dielectric layer on a top surface of a semiconductor substrate, said dielectric layer having a top surface and a bottom surface;
  a trench in said dielectric layer, said trench extending from said top surface to said bottom surface of said dielectric layer;

a first plate of a MIM capacitor comprising a conformal conductive liner having a top surface and a bottom surface, said bottom surface of said conformal conductive liner in direct physical contact with all sidewalls and extending along a bottom of said trench, said bottom of said trench coplanar with said bottom surface of said dielectric layer;

a conformal insulating layer formed on said top surface of said conformal conductive liner;

a second plate of said MIM capacitor comprising a single layer of a core conductor in direct physical contact with said insulating layer, said core conductor filling spaces in said trench not filled by said conformal conductive liner and said insulating layer;

a conductive plate under said dielectric layer and in direct physical and electrical contact with said conformal conductive liner, a less than whole portion of a top surface of said conductive plate coextensive with a less than whole portion of a bottom surface of said conductive liner; and a conductive contact formed in said dielectric layer and extending from said top surface of said dielectric layer to said bottom surface of said dielectric layer, said conductive contact in direct physical and electrical contact with another less than whole portion of said top surface of said conductive plate.

2. The structure of claim 1, wherein said dielectric layer comprises an upper dielectric layer and a lower dielectric layer, a bottom surface of said upper dielectric layer in direct physical contact with a top surface of said lower dielectric layer, a bottom surface of said lower dielectric layer being said bottom surface of said dielectric layer and a top surface of said upper dielectric layer being said top surface of said dielectric layer.

3. The structure of claim 1, further including:
an additional trench formed in said dielectric layer;
an additional conformal conductive liner formed on all sidewalls and a bottom of said additional trench, said bottom of said additional trench coplanar with said bottom surface of said dielectric layer;
an additional core conductor, said additional conductor filling spaces in said additional trench not filled by said additional conformal conductive liner.

4. The structure of claim 3, wherein said conformal conductive liner and said additional conformal conductive liner are physically a same layer but not connected to each other.

5. The structure of claim 3, further including:
wherein said conformal conductive liner and said additional conformal conductive liner consist of a same material.

6. The structure of claim 5, wherein said core conductor and said additional core conductor consist of a same material.

7. The structure of claim 1, further including:
one or more dielectric islands comprising said dielectric layer, said one or more dielectric islands extending from said bottom surface of said dielectric layer toward said top surface of said dielectric layer a first distance, said first distance less than a second distance between said top and bottom surfaces of said dielectric layer.

8. The structure of claim 7, wherein said conformal conductive liner and said insulating layer cover all surfaces of said one or more dielectric islands except bottom surfaces of said dielectric islands that are coplanar with said bottom surface of said dielectric layer.

9. The structure of claim 1, wherein:
said dielectric layer comprises a material selected from the group consisting of silicon dioxide, silicon nitride, silicon carbide, silicon oxy nitride, silicon oxy carbide, hydrogen doped silica glass plasma-enhanced silicon nitride, NBLoK, a low dielectric constant material, hydrogen silsesquioxane polymer, methyl silsesquioxane polymer, polyphenylene oligomer and combinations thereof;

said conformal conductive liner comprises a material selected from the group consisting of Ta, TaN, Ti, TiN, TiSiN, W and combinations thereof; and said core conductor is selected from the group consisting of Cu, Al, AlCu and W.

10. The structure of claim 1, wherein said insulating layer comprises a material selected from the group consisting of silicon dioxide, silicon nitride, silicon carbide, silicon oxy nitride, silicon oxy carbide, hydrogen doped silica glass, plasma-enhanced silicon nitride, NBLoK, a high dielectric constant material, metal oxide, $Ta_2O_5$, $BaTiO_3$, $HfO_2$, $ZrO_2$, $Al_2O_3$, metal silicates, $HfSi_xO_y$, $HfSi_xO_yN_z$ and combinations thereof.

11. The method of claim 1, wherein said conformal conductive liner is a copper diffusion barrier.

12. The method of claim 1, wherein said dielectric layer is between about 50 nm and about 1,000 nm thick.

13. The method of claim 1, wherein said conformal conductive liner is between about 5 nm and about 100 nm thick and said conformal insulating layer is between about 5 nm and about 100 nm thick.

14. The structure of claim 1, wherein:
an entire top surface of said core conductor coplanar with said top surface of said dielectric layer.

15. The structure of claim 1, wherein:
an entire top surface of said core conductor is recessed below said top surface of said dielectric layer.

16. The structure of claim 1, wherein said conductive plate has a first side and an opposite second side and a third and opposite fourth side, said third and fourth sides connecting said first and second sides and defining a perimeter of said conductive plate, said bottom surface of said conformal conductive liner contacting said top surface of said conductive plate only within said perimeter.

17. The structure of claim 1, wherein said conductive plate has a first side and an opposite second side and a third and opposite fourth side, said bottom surface of said conformal conductive liner overlapping at least two opposite sides of said first, second, third and fourth sides.

18. The structure of claim 1, wherein said bottom of said trench is rectangular in shape.

19. A structure, comprising:
a dielectric layer on a top surface of a semiconductor substrate, said dielectric layer having a top surface and a bottom surface;

a trench in said dielectric layer, said trench extending from said top surface to said bottom surface of said dielectric layer;

a first plate of a MIM capacitor comprising a conformal conductive liner and a first core conductor, a bottom surface of said conformal conductive liner in direct physical contact with sidewalls of said trench and extending along a bottom of said trench, said bottom of said trench coplanar with said bottom surface of said dielectric layer, said first core conductor filling a lower region of said trench and in contact with said contacting conductive liner in said lower region of said trench;

a conformal insulating layer formed on a top surface of said conformal conductive liner;

only in an upper region of said trench and on a top surface of said first core conductor;

a second plate of said MIM capacitor comprising a second core conductor in direct physical contact with said insulating layer, said core conductor filling spaces in said trench not filled by said conformal conductive liner, said first core conductor and said conformal insulating layer;

two or more dielectric islands comprising said dielectric layer, said two or more dielectric islands extending from said bottom surface of said dielectric layer toward said top surface of said dielectric layer a first distance, said first distance less than a second distance between said top and bottom surfaces of said dielectric layer; and said first core conductor disposed between said two or more dielectric islands, top surfaces of said first core conductor closer to said bottom surface of said dielectric layer than top surfaces of said dielectric islands.

20. The structure of claim 19, wherein:

said dielectric layer comprises a material selected from the group consisting of silicon dioxide, silicon nitride, silicon carbide, silicon oxy nitride, silicon oxy carbide, hydrogen doped silica glass plasma-enhanced silicon nitride, NBLoK, a low dielectric constant material, hydrogen silsesquioxane polymer, methyl silsesquioxane polymer, polyphenylene oligomer and combinations thereof;

said conformal conductive liner comprises a material selected from the group consisting of Ta, TaN, Ti, TiN, TiSiN, W and combinations thereof; and said first and second core conductors are independently selected from the group consisting of Cu, Al, AlCu and W.

21. The structure of claim 19, wherein said insulating layer comprises a material selected from the group consisting of silicon dioxide, silicon nitride, silicon carbide, silicon oxy nitride, silicon oxy carbide, hydrogen doped silica glass, plasma-enhanced silicon nitride, NBLoK, a high dielectric constant material, metal oxide, $Ta_2O_5$, $BaTiO_3$, $HfO_2$, $ZrO_2$, $Al_2O_3$, metal silicates, $HfSi_xO_y$, $HfSi_xO_yN_z$ and combinations thereof.

22. The method of claim 19, wherein said conformal conductive liner is a copper diffusion barrier.

23. The method of claim 19, wherein said dielectric layer is between about 50 nm and about 1,000 nm thick.

24. The method of claim 19, wherein said conformal conductive liner is between about 5 nm and about 100 nm thick and said conformal insulating layer is between about 5 nm and about 100 nm thick.

25. The structure of claim 19, wherein:

an entire top surface of said second core conductor coplanar with said top surface of said dielectric layer.

26. The structure of claim 19, wherein:

an entire top surface of said second core conductor is recessed below said top surface of said dielectric layer.

* * * * *